(12) United States Patent
Klein et al.

(10) Patent No.: US 7,534,487 B2
(45) Date of Patent: May 19, 2009

(54) TRANSPARENT, ELECTRICALLY CONDUCTIVE, COATED POLYESTER FILM, PROCESS FOR ITS PRODUCTION, AND ITS USE

(75) Inventors: Dagmar Klein, Mainz (DE); Holger Kliesch, Mainz (DE); Thorsten Kiehne, Wiesbaden (DE); Bodo Kuhmann, Runkel (DE); Franz Hora, Kriftel (DE); Gottfried Hilkert, Saulheim (DE); Manfred Wiederhold, Wiesbaden (DE)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 0 days.

(21) Appl. No.: 11/083,767

(22) Filed: Mar. 18, 2005

(65) Prior Publication Data
US 2005/0214526 A1 Sep. 29, 2005

(30) Foreign Application Priority Data
Mar. 25, 2004 (DE) .................. 10 2004 014 645

(51) Int. Cl.
*B32B 27/08* (2006.01)
*B32B 27/18* (2006.01)
*B32B 27/36* (2006.01)
*B32B 15/09* (2006.01)
*B32B 37/02* (2006.01)

(52) U.S. Cl. .................. 428/328; 428/323; 428/446; 428/480; 524/401; 524/409; 524/430; 264/288.4; 264/290.2; 264/173.16

(58) Field of Classification Search .......... None
See application file for complete search history.

(56) References Cited

U.S. PATENT DOCUMENTS

| | | | | |
|---|---|---|---|---|
| 4,299,748 A * | 11/1981 | Hashizume et al. | .......... | 524/519 |
| 4,431,764 A * | 2/1984 | Yoshizumi | .................. | 524/409 |
| 4,571,363 A * | 2/1986 | Culbertson et al. | .......... | 428/332 |
| 4,623,594 A * | 11/1986 | Keough | ...................... | 428/500 |
| 4,731,408 A | 3/1988 | Jasne | ........................ | 524/458 |
| 4,954,396 A * | 9/1990 | Swofford et al. | ............ | 428/340 |
| 4,987,042 A | 1/1991 | Jonas et al. | .................. | 429/213 |
| 5,093,439 A | 3/1992 | Epstein et al. | .............. | 525/540 |
| 5,300,575 A | 4/1994 | Jonas et al. | ................. | 525/186 |
| 5,312,681 A | 5/1994 | Muys et al. | ................. | 428/323 |
| 5,354,613 A | 10/1994 | Quintens et al. | ............ | 428/341 |

(Continued)

FOREIGN PATENT DOCUMENTS

EP      0 359 017 A2     3/1990

(Continued)

*Primary Examiner*—Vivian Chen
(74) *Attorney, Agent, or Firm*—ProPat, L.L.C.

(57) ABSTRACT

The invention relates to a transparent, electrically conductive, biaxially oriented, single- or multilayer polyester film which includes a coating composed of (a) conductive (ITO) indium tin oxide particles or (ATO) antimony tin oxide particles, or of a mixture of these. The film further include other conductive components (b). The other conductive components (b) may be present either in the coating including ITO particles and/or ATO particles or in a layer in contact therewith. The conductive component (b) may also be a metal layer in contact with the ITO and/or ATO. The film is only oriented or relaxed prior to application of the ITO and/or ATO coating. The invention further relates to a process for the production of the film, and its use.

18 Claims, 1 Drawing Sheet

U.S. PATENT DOCUMENTS

| | | | |
|---|---|---|---|
| 5,370,981 A | 12/1994 | Krafft et al. | 430/529 |
| 5,372,924 A | 12/1994 | Quintens et al. | 430/527 |
| 5,391,472 A | 2/1995 | Muys et al. | 430/527 |
| 5,403,467 A | 4/1995 | Jonas et al. | 205/125 |
| 5,411,792 A * | 5/1995 | Yukinobu et al. | 428/212 |
| 5,413,739 A * | 5/1995 | Coleman | 252/511 |
| 5,415,690 A * | 5/1995 | Watanabe | 106/287.16 |
| 5,421,926 A * | 6/1995 | Yukinobu et al. | 156/83 |
| 5,443,944 A | 8/1995 | Krafft et al. | 430/529 |
| 5,500,759 A * | 3/1996 | Coleman | 359/270 |
| 5,504,133 A * | 4/1996 | Murouchi et al. | 524/430 |
| 5,575,898 A | 11/1996 | Wolf et al. | 205/125 |
| 5,580,496 A * | 12/1996 | Yukinobu et al. | 252/520.1 |
| 5,662,962 A * | 9/1997 | Kawata et al. | 427/126.2 |
| 5,665,498 A | 9/1997 | Savage et al. | 430/41 |
| 5,674,654 A | 10/1997 | Zumbulyadis et al. | 430/41 |
| 5,716,550 A | 2/1998 | Gardner et al. | 252/500 |
| 5,728,339 A | 3/1998 | Farrar | 264/134 |
| 5,763,091 A * | 6/1998 | Kawata et al. | 428/428 |
| 5,812,300 A * | 9/1998 | Coleman | 359/265 |
| 5,820,843 A * | 10/1998 | Yukinobu et al. | 423/594.9 |
| 5,958,537 A * | 9/1999 | Akhter | 428/40.2 |
| 6,017,610 A * | 1/2000 | Abe et al. | 428/195.1 |
| 6,060,229 A * | 5/2000 | Eichorst et al. | 430/529 |
| 6,104,530 A * | 8/2000 | Okamura et al. | 359/359 |
| 6,194,054 B1 * | 2/2001 | Peiffer et al. | 428/141 |
| 6,211,274 B1 * | 4/2001 | Tanegashima et al. | 524/399 |
| 6,511,614 B1 * | 1/2003 | Yukinobu et al. | 252/520.21 |
| 6,663,956 B2 * | 12/2003 | Heberger et al. | 428/332 |
| 6,811,878 B2 * | 11/2004 | Kawamura et al. | 428/402 |
| 6,987,354 B2 * | 1/2006 | Arakawa et al. | 313/506 |
| 7,022,388 B2 * | 4/2006 | Hashimoto et al. | 428/34.9 |
| 7,087,351 B2 * | 8/2006 | Aylward et al. | 430/20 |
| 7,153,620 B2 * | 12/2006 | Aylward et al. | 430/62 |
| 2002/0045050 A1 * | 4/2002 | Tamai et al. | 428/432 |
| 2003/0008135 A1 * | 1/2003 | Kawamura et al. | 428/336 |

FOREIGN PATENT DOCUMENTS

| | | | |
|---|---|---|---|
| EP | 0 962 482 A1 | | 12/1999 |
| EP | 0 962 486 A2 | | 12/1999 |
| EP | 1 020 762 A2 | | 7/2000 |
| EP | 1 253 166 A2 | | 10/2002 |
| EP | 1 471 415 A2 | | 10/2004 |
| JP | 04-073809 | * | 3/1990 |
| JP | 02-199991 | * | 3/1992 |
| JP | 04-073809 | * | 3/1992 |
| JP | 04-085371 | * | 3/1992 |
| JP | 11-058598 | * | 3/1999 |
| JP | 2000 0188432 | | 7/2000 |
| JP | 2001 82557 | | 3/2001 |
| JP | 2001 099924 | | 4/2001 |
| JP | 2003 154594 | | 5/2003 |
| WO | WO 03/012799 A1 | | 2/2003 |

* cited by examiner

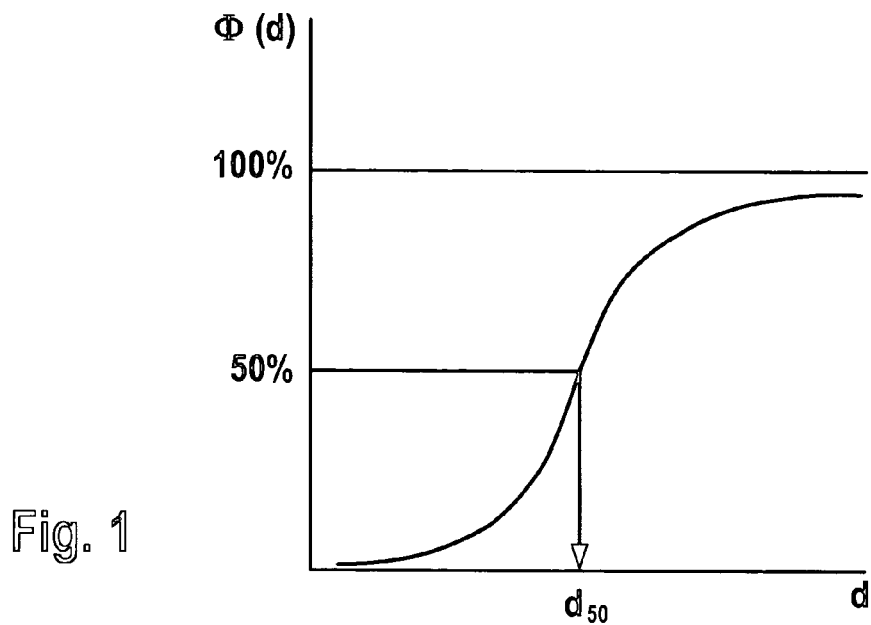
Fig. 1
Fig. 2
haze reading in transverse direction
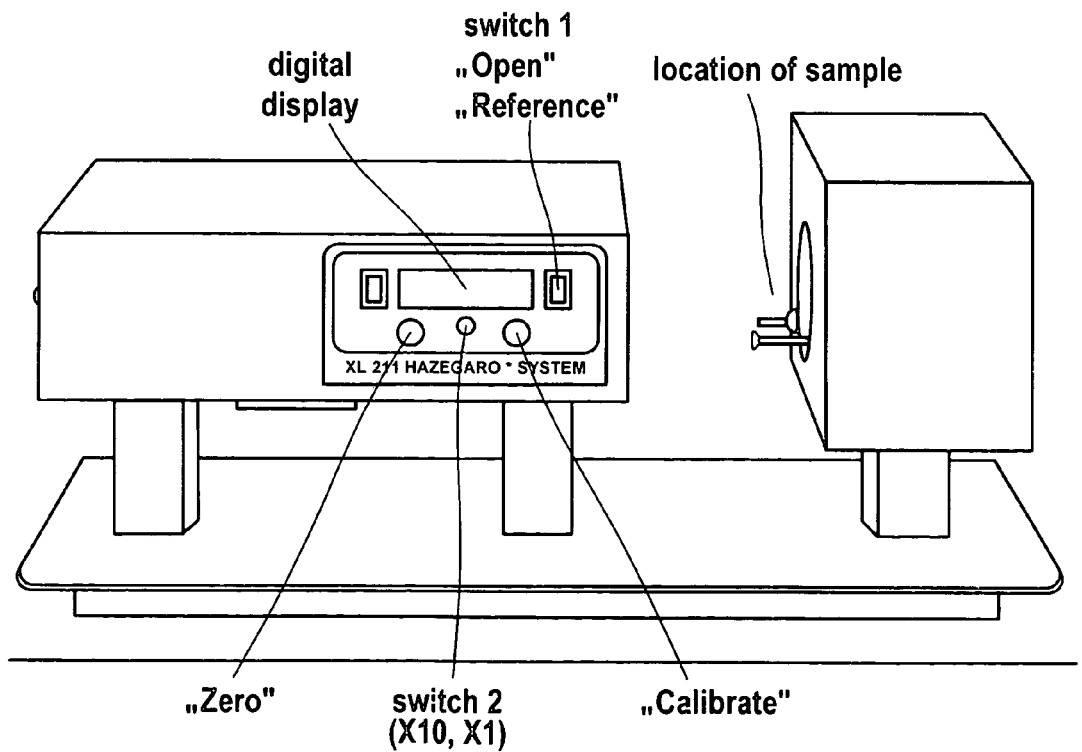

TRANSPARENT, ELECTRICALLY CONDUCTIVE, COATED POLYESTER FILM, PROCESS FOR ITS PRODUCTION, AND ITS USE

CROSS-REFERENCE TO RELATED APPLICATIONS

This application claims priority to German Application No. 10 2004 014 645.4, filed in the Federal Republic of Germany on Mar. 25, 2004, hereby incorporated by reference herein in its entirety.

FIELD OF THE INVENTION

The invention relates to a transparent, electrically conductive, biaxially oriented, single- or multilayer polyester film which comprises a coating composed of a) conductive ITO (indium tin oxide) particles or ATO (antimony tin oxide) particles, or of a mixture of these. It also has other conductive components b). These are present either in the layer comprising ITO particles and ATO particles or in a layer in contact therewith. The term "a conductive component b)" also includes a metal layer in contact with the ITO/ATO layer. The film is only oriented or relaxed prior to application of the ITO/ATO coating. The invention further relates to a process for the production of the film, and its use.

BACKGROUND OF THE INVENTION

Transparent conductive systems (conductive substrates) are needed, by way of example, for production of modern displays or solar cells. Other applications are screening with respect to electromagnetic radiation and general use as electrode material.

Frequently used substrates are glass and similar materials. However, flexible substrates, such as polyester film, are desirable for many applications.

In industry, films having a conductive coating are generally metallized films. These films generally have low transparency (<30%) for visible light, and have to be metallized in a vacuum process. Transparent conductive films often have a coating with ITO (indium tin oxide) or ATO (antimony tin oxide) applied via sputtering (see WO 2003/12799 from Toyo Boseki). However, the sputtering process limits production rate and the dimension of the item to be coated and is therefore uneconomic. It is therefore desirable to be able to coat the film by a coating method which permits higher production rates. An example of this type of method is coating from solution or dispersion, inter alia by means of application rolls. For this, the conductive constituents have to be introduced into a coating solution. Conductive coatings may, by way of example, comprise conductive, organic polymers.

JP-A-2000-188432 (TDK Corp., JP) and JP-A-2001-099924 (Sekisui Chem. Corp., JP) describe electrically conductive coatings based on nano-scale ITO and, respectively, ATO. However, the conductive coatings described there have the disadvantage of themselves having low flexibility, due to the brittleness of the ITO coating, therefore losing their conductivity when exposed to mechanical stress, such as flexure.

JP-C-2003-154594 and EP-B-1 020 762 describe coatings with low conductivity based on organic conductive components in the range from $10^7$ to $10^9$ ohm/cm$^2$. Among the disadvantages here are the low conductivities described and the low stability of the conductive materials used with respect to oxidative degradation and UV light (below 380 nm).

EP-B-0 962 486 describes coatings with low conductivity based on organic conductive components in the range from $10^8$ to $10^{10}$ ohm/cm$^2$. Here, conductive inorganic metal oxides are mixed with conductive organic polymers and coated onto polyester film. Among the disadvantages here are the low conductivities described, and no information is given concerning the transparency of the films. Reasons for the low performance level of the films described may well lie within the method of coating, which takes place on a polyester film which has not at that stage completed its crystallization, and indeed the film is then oriented and thus exposed to high mechanical stress which, in particular when inorganic conductors are used, is associated with embrittlement of the layer with loss of most of the conductivity and of the transparency.

BRIEF SUMMARY OF THE INVENTION

A disadvantage common to all of the cited applications is that it is generally impossible to achieve surface resistivities below $10^7$ ohm/cm$^2$ and is certainly impossible to achieve surface resistivities below $10^3$ ohm/cm$^2$. However, lower resistivities are needed for many applications.

It is an object of the present invention to provide a film which does not have the disadvantages mentioned.

BRIEF DESCRIPTION OF THE DRAWINGS

FIG. 1 is a graphical illustration of an exemplary cumulative particle size distribution curve.

FIG. 2 is a schematic illustration of an exemplary haze meter.

DETAILED DESCRIPTION OF THE INVENTION

The invention provides a transparent, electrically conductive biaxially oriented, single- or multilayer polyester film, which has a coating which comprises a) conductive ITO (indium tin oxide) particles or ATO (antimony tin oxide) particles, or a mixture of these and also comprises other conductive components b), these conductive components b) being found either in the layer comprising ITO particles and ATO particles or in a layer in contact therewith.

The term "a conductive component b)" includes a metal layer in contact with the ITO/ATO layer.

It is moreover possible for the film to be equipped with another conductive layer.

The inventive film is either a single- or a multilayer film.

The conductive coating has surface resistivities of from $10^0$ to $10^7$ ohm/cm$^2$.

The polyester substrate film has been biaxially stretched and has a thickness of from 1 to 500 µm, preferably from 8 to 200 µm, and particularly preferably from 12 to 75 µm.

The outer layer comprising the ITO particles or ATO particles has a thickness of from 0.05 to 5 µm, preferably from 0.1 to 3 µm, and particularly preferably from 0.5 to 1 µm.

To improve conductivity, the film has either in addition to the outer layer comprising ITO particles or ATO particles, and in contact with that layer, at least one other layer which is either a metallization or a coating with a conductive polymer, or/and in addition to the ITO particles or ATO particles, at least one conductive polymer in the outer layer.

In one preferred embodiment, there is no film direction (neither MD nor TD) in which the shrinkage of the film at 200° C. is greater than 25%. Shrinkage at 200° C. is preferably ≦15% and in particular ≦4%.

In another preferred embodiment, the shrinkage of the film at 200° C. in the transverse direction (TD) is ≦4%, preferably ≦2%, and particularly preferably ≦1%.

The transparency of the film for light of wavelength in the range from 410 to 750 nm is ≧25%, preferably ≧60%, and particularly preferably ≧70%.

The inventive single- or multilayer films have good mechanical properties. For example, the modulus of elasticity in at least one film direction (longitudinal direction (MD) and/or transverse direction (TD)) is at least 500 N/mm², preferably at least 2000 N/mm², and particularly preferably at least 4000 N/mm². The ultimate tensile strength values in at least one film direction (longitudinal direction (MD) and/or transverse direction (TD)) are ≧50 N/mm², preferably ≧100 N/mm², and particularly preferably ≧150 N/mm². The tensile-strain-at-break values in at least one film direction (longitudinal direction (MD) and/or transverse direction (TD)) are ≧10%, preferably ≧40%, and particularly preferably ≧80%.

The inventive single- or multilayer film is based on polyesters. In particular the base layer, but also the outer layer and/or intermediate layers comprise a polyester, as main polymer constituent (i.e. to an extent of from 55 to 100% by weight, preferably from 70 to 100% by weight, and particularly preferably from 90 to 100% by weight, based on the weight of the respective layer).

According to the invention, the term "a polyester" means
homopolyester,
copolyester,
blends of different polyesters where these may be used either in the form of pure raw materials as well as in the form of polyester raw materials comprising recycled material.

Polyesters contain repeat units which derive from dicarboxylic acids (100 mol %) and from diols (likewise 100 mol %). The inventive polyesters are preferably based on terephthalic acid or 2,6-naphthalenedicarboxylic acid as dicarboxylic acid and on ethylene glycol or 1,4-butanediol as diol (PET, PBT or PEN), or a mixture of these.

In particular, the inventive polyesters contain from 10 to 100 mol % of terephthalate or from 10 to 100 mol % of 2,6-naphthalate as dicarboxylic acid components (the total amount of dicarboxylic acid components making up 100 mol %). Other dicarboxylic acid components which may be present in the inventive polyester are from 0 to 50 mol % of 2,6-naphthalate (if terephthalate was used as main component), from 0 to 50 mol % of terephthalate (if naphthalate was used as main component), from 0 to 20 mol % of isophthalate (preferably from 0.5 to 10 mol % and particularly preferably from 2 to 6 mol %), and also from 10 to 60 mol % of 4,4'-diphenyldicarboxylate. Other dicarboxylic acid components, such as 1,5-naphthalenedicarboxylate, should not exceed a proportion of 30 mol %, preferably 10 mol %, in particular 2 mol %.

As diol component, the inventive polyester contains from 10 to 100 mol % of ethylene glycol (EG) (the entire amount of diol components making up 100 mol %). If mixtures of different diols are used the proportion of diethylene glycol should not exceed 10 mol %, and is ideally from 0.5 to 5 mol %. Other diol components, such as cyclohexanedimethanol, 1,3-propanediol, 1,4-butanediol should not exceed a proportion of 50 mol %, their proportion preferably being ≦30 mol %, particularly preferably ≦10 mol %.

Mixtures of polyesters may be used.

The polyester composition of functional outer layers may deviate from what has been described above, and is described by way of example in the text below concerning sealable outer layers.

Besides the specified main polymer constituents, other embodiments of the film layers may contain up to 45% by weight, preferably up to 30% by weight, particularly preferably up to 20% by weight, based on the weight of the respective film layer, of other polymers, such as polyetherimides (e.g. ULTEM® 1000 from GE Plastics Europe, NL), polycarbonate (e.g. MAKROLON® from Bayer, DE), polyolefins, such as COCs (e.g. TOPAS® from Ticona, DE), polyamides (ULTRAMID® from BASF, DE), etc.

The polyesters are generally prepared by processes known from the literature from the dicarboxylic acid or dicarboxylic ester and the diols mentioned. The polyesters may either be prepared by the trans-esterification process using the usual catalysts, e.g. salts of Zn, of Ca, of Li, or of Mn, or by the direct esterifiction process.

The multilayer films are composed at least of a base layer B, of at least one outer layer A or C, and, where appropriate, of other intermediate layers, preference in particular being given to a three-layer A-B-A or A-B-C structure. For these embodiments, it is advantageous for the polymer of the base layer B to have a melt viscosity similar to that/those of the outer layer(s) adjacent to the base layer.

In one preferred embodiment, the functional layer C is sealable. This sealable outer layer applied via coextrusion to the base layer B has a structure based on polyester copolymers. For the purposes of the invention, two variants are preferred here:

A: Copolyester composed of terephthalic acid and isophthalic acid

B: Copolyester composed of terephthalic acid and naphthalenedicarboxylic acid

Variant A:

The polymer of the sealable outer layer is composed of copolyesters composed mainly, i.e. to an extent of at least from 75 to 95 mol %, of isophthalic acid components and terephthalic acid components in the dicarboxylic acid category, and from 70 to 95 mol % of ethylene glycol components in the diol category. The remaining monomer units derive from the other aliphatic, cycloaliphatic, or aromatic diols and, respectively, dicarboxylic acids which may also occur in the base layer. The preferred copolyesters, which provide the desired sealing properties, are those whose structure is composed of ethylene terephthalate components and ethylene isophthalate components. The proportion of ethylene terephthalate is from 40 to 95 mol %, and the corresponding proportion of ethylene isophthalate is from 60 to 5 mol %. Preference is given to copolyesters in which the proportion of ethylene terephthalate is from 50 to 90 mol % and the corresponding proportion of ethylene isophthalate is from 50 to 10 mol %, and very particular preference is given to copolyesters in which the proportion of ethylene terephthalate is from 60 to 85 mol % and the corresponding proportion of ethylene isophthalate is from 40 to 15 mol %.

Variant B:

The polymer of the sealable outer layer is composed of copolyesters composed mainly, i.e. to an extent of at least from 70 to 95 mol %, of naphthalenedicarboxylic acid components and terephthalic acid components in the dicarboxylic acid category, and of ethylene glycol components in the diol category. The remaining monomer units derive from the other aliphatic, cycloaliphatic, or aromatic diols and, respectively, dicarboxylic acids which may also occur in the base layer.

The preferred copolyesters, which provide the desired sealing properties, are those whose structure is composed of ethylene terephthalate components and ethylene naphthalate components. The proportion of ethylene terephthalate is from 30 to 75 mol %, and the corresponding proportion of ethylene naphthalate is from 70 to 25 mol %. Preference is given to copolyesters in which the proportion of ethylene terephthalate is from 40 to 60 mol % and the corresponding proportion of ethylene naphthalate is from 60 to 40 mol %. If the content of polyethylene naphthalate (PEN) in the sealable layer is inadequate to achieve the inventive total content of PEN in the film layer, the balancing PEN content required should advantageously be added to the base layer, and a PEN-free outer layer should advantageously be applied.

Variants A and B may be combined with one another. The minimum amounts of isophthalic acid (IPA) and, respectively, PEN can thus be reduced. However, for PET/PEN/polyethylene isophthalate sealable layers (PET=polethylene terephthalate) it has proven advantageous for the PEN content of the sealable layer to be at least 15% by weight and the polyethylene isophthalate content to be at least 5% by weight.

The thickness of the outer layer(s) is selected independently of the other layers and is generally in the range from 0.1 to 10 µm, preferably from 0.2 to 5 µm, more preferably from 1 to 3 µm, and the thickness and composition of outer layers applied here on the two sides may be identical or different. The thickness of the base layer is correspondingly calculated from the difference between the total thickness of the film and the thickness of the outer and intermediate layer(s) applied, and can therefore, like the total thickness, vary within wide boundaries.

One or more layers of the inventive film may comprise other particulate additives, such as fillers and antiblocking agents. Typical fillers and antiblocking agents are inorganic and/or organic particles, such as silocon dioxide (natural, precipitated or fumed), calcium carbonate, magnesium carbonate, barium carbonate, calcium sulfate, barium sulfate, lithium phosphate, calcium phosphate, magnesium phosphate, titanium dioxide (rutile or anatase), kaolin (hydrated or calcined), aluminum oxide, aluminum silicates, lithium fluoride, the calcium, barium, zinc, or manganese salts of the dicarboxylic acids used, or crosslinked polymer particles, e.g. polystyrene or polymethyl methacrylate particles.

It is also possible to select mixtures of two or more of the abovementioned particle systems or mixtures of particle systems with the same chemical composition but different particle size. The particles are advantageously added to the polyester before melting begins.

If a layer of the film comprises further particulate additives, the total concentration of these particles is generally ≦10% by weight, based on the total weight of the modified layer, preferably ≦5% by weight, and particularly preferably ≦1% by weight. The particulate additives have an average size ($d_{50}$ value) of from 0.01 to 10 µm, preferably from 0.03 to 5 µm, and particularly preferably from 0.05 to 1 µm. In one preferred embodiment, the proportion of particles with $d_{50} \geqq 3$ µm is ≦1000 ppm, preferably ≦300 ppm, and particularly preferably ≦100 ppm.

In one preferred embodiment, the film comprises from 0.1 to 2% by weight, preferably from 0.5 to 1.5% by weight, of silicon dioxide particles with $d_{50} \leqq 1$ µm, and from 0 to 500 ppm of silicon dioxide particles with $d_{50}$ greater than 1 µm and ≦3 µm.

The inventive film may comprise other additives, such as UV stabilizers, flame retardants, hydrolysis stabilizers, and antioxidants.

In one preferred embodiment, the base film prior to off-line coating has a haze of ≦4%, preferably ≦3%, and particularly preferably of ≦2%. To achieve this preferred embodiment, it has proven advantageous to use titanium compounds at ≦50 ppm, preferably ≦20 ppm as polycondensation catalyst to prepare the polyester. It is also advantageous for the total content of other catalyst components, such as transesterification catalysts (e.g. manganese salts) and of phosphorus-containing stabilizers not to exceed 150 ppm, preferably 100 ppm, and particularly preferably 75 ppm.

In another embodiment, at least one layer of the inventive film is flame-retardant. Flame-retardant means that in what is known as a fire protection test to UL94 VTM the film achieves at least the classification VTM-2. The film then comprises, in one or more layers, a flame retardant at a concentration in the range from 0.2 to 30% by weight, preferably from 0.5 to 25% by weight, particularly preferably from 1 to 20% by weight, based on the weight of the modified layer. It is important that the flame retardant is soluble in the polyester, because otherwise the required mechanical properties are not achieved. Examples of suitable flame retardants are organic bromine, chlorine, or nitrogen compounds, or metal hydroxides or metal oxide trihydrates. However, the halogen compounds have the disadvantage that toxic and corrosive hydrogen halides are produced in the event of a fire. Another disadvantage is the low light-resistance of a film equipped therewith. Examples of other suitable flame retardants are organophosphorus compounds, such as carboxyphosphinic acids, their anhydrides, and dimethyl methanephosphonate. Very suitable flame retardants here are those in which the phosphorus compound has chemical bonding to the polyester. Very particular preference is given to bis(2-hydroxyethyl) [(6-oxido-6H-dibenzo[c,e][1,2]oxaphosphorin-6-yl)methyl]butanedicarboxylate of the formula

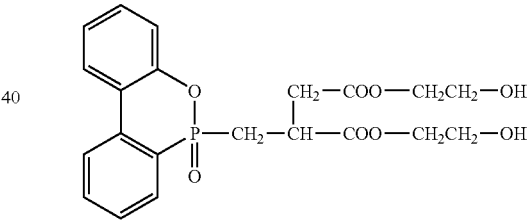

In this preferred embodiment, the inventive low-flammability film comprises, besides the polyester, the compound capable of activation by radiation, and, if appropriate, particulate additives, from 1 to 20% by weight of an organophosphorus compound as flame retardant soluble in the polyester.

Because the flame retardants generally have some susceptibility to hydrolysis, it may be advisable to add a hydrolysis stabilizer. Examples of suitable hydrolysis stabilizers are polymeric carbodiimides, e.g. STABAXOL® P from Rheinchemie (DE). The amount of these used is preferably from 0.1 to 1.0% by weight (based on the weight of the modified layer).

These abovementioned proportions of flame retardant and hydrolysis stabilizer have also proven advantageous when the main constituent of the film is not polyethylene terephthalate but another polyester.

In another preferred embodiment, the transparent film comprises at least one UV stabilizer as light stabilizer, which is advantageously metered in directly during film production by way of what is known as masterbatch technology, the preferred concentration of this UV stabilizer being from 0.01 to 5% by weight, based on the weight of the layer of the crystallizable thermoplastic. This is particularly advantageous because the ultraviolet content of light, i.e. the wavelengths in the range from 280 to 400 nm, degrades the organic conductive polymers present in the conductive layer in the preferred embodiment.

UV stabilizers which are suitable light stabilizers are UV stabilizers which absorb at least 70%, preferably 80%, and particularly preferably 90%, of the UV light of wavelengths in the range from 180 to 380 nm, preferably from 280 to 350 nm. These are particularly suitable if they are thermally stable in the temperature range from 260 to 300° C., i.e. do not decompose and do not cause evolution of gas. Examples of UV stabilizers suitable as light stabilizers are 2-hydroxybenzophenones, 2-hydroxybenzotriazoles, organonickel compounds, salicylic esters, cinnamic ester derivatives, resorcinol monobenzoates, oxanilides, hydroxybenzoic esters, and sterically hindered amines and triazines, preference being given to the 2-hydroxybenzotriazoles and the triazines.

In one particularly preferred embodiment, the inventive transparent film comprises from from 0.01 to 5% by weight of 2-(4,6-diphenyl-1,3,5-triazin-2-yl)-5-(hexyl)oxyphenol, or from 0.01 to 5% by weight of 2,2'-methylene-bis(6-(2H-benzotriazol-2-yl)-4-(1,1,3,3-tetramethylbutyl)phenol. In one preferred embodiment, it is also possible to use a mixture of these two UV stabilizers or a mixture of at least one of these two UV stabilizers with other UV stabilizers, the total concentration of light stabilizer here preferably being in the range from 0.01 to 5% by weight, based on the weight of polymer.

In another preferred embodiment, the inventive film has an increased oxygen barrier, which can, by way of example, be achieved via coating and additives, these being described by way of example in the two unpublished German applications 103 02 035.7 and 103 02 036.5.

The other additives used, such as particles, UV stabilizers, flame retardants, hydrolysis stabilizers, and antioxidants, may be added in the form of a glycolic dispersion during the polycondensation process, to the polyester used to produce the inventive film. However, preference is given to addition of the other additives used by way of masterbatches to the polyester raw material during film extrusion.

The film may also be coated in order to establish other properties. Particularly typical coatings are layers with adhesion-promoting, slip-improving, or release action. These additional layers may, of course, be applied to the film by way of in-line coating by means of aqueous dispersions after longitudinal stretching and prior to transverse stretching.

In one particular embodiment, one side of the film has a silicone coating, this being described by way of example in U.S. Pat. No. 5,728,339. This embodiment has the advantage that it is easier to remove contamination from the film with its conductive coating, if this film is simultaneously the outward-facing layer of a display or of another electronic component.

For certain applications, it can be advantageous to pretreat the surface of the film chemically, using an acid. Materials particularly suitable for this "adhesion-promoting etch" are trichloroacetic acid, dichloroacetic acid, or hydrofluoric acid, which act on the surface for a short time (from 5 to 120 s) and then are removed by means of an air knife. This gives the film a very reactive, amorphous surface.

In one preferred embodiment, at least one surface of the film is coated with an aqueous solution or, respectively, dispersion of a hydrolyzed aminosilane compound. The coating is preferably applied in-line, i.e. during the film production process, advantageously prior to transverse stretching. Particular preference is given to applying the coating by means of reverse gravure roll coating, which can apply the coating extremely homogeneously. Preference is also given to applying the coating by the Meyer rod process, which can achieve relatively high coating thicknesses. The coating is applied in the form of a dilute aqueous solution or, respectively, dispersion to the film, and then the solvent or dispersion medium is evaporated. If the coating is applied in-line prior to transverse stretching, the heat treatment during transverse stretching is generally sufficient to evaporate the solvent or dispersion medium and to dry the coating.

Suitable aminosilane compounds have, in the unhydrolyzed state, the general formula

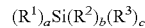

where $R^1$ is a functional group having at least one primary amino group, and is preferably a group having the formula —X—Y-Z-NH$_2$, where X=C$_1$-C$_4$-alkylene or C$_6$-C$_{10}$-arylene, Y=O, NH, or a bond, Z=C$_1$-C$_4$-alkylene or C$_6$-C$_{10}$-arylene, and $R^2$ is a hydrolyzable group selected from the group consisting of an alkoxy group having from 1 to 8 carbon atoms, an acetoxy group, and a halide, and $R^3$ is an unreactive, non-hydrolyzable group selected from the group consisting of an alkyl group having from 1 to 8 carbon atoms and a phenyl group. The coefficient a is ≧1, the coefficient b is likewise ≧1, and the coefficient c is ≧0, and a+b+c=4.

N-(2-Aminoethyl)-3-aminopropyltrimethoxysilane of the formula

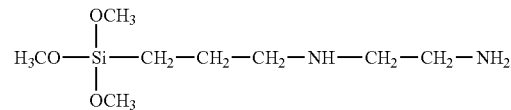

is preferred as aminosilane compound. This compound is supplied commercially by Dow Corning (DE) with the name Z-6020.

The inventive coating described above has been described in detail in EP-B-0 359 017, which is expressly incorporated herein by way of reference. That specification also describes other suitable aminosilane compounds which, although they are not given here, are expressly encompassed by the present invention.

The coating comprises simultaneously, alongside aminosilane compounds, the amounts given below of the organic conductive components described at a later stage below, and is therefore an adhesion-promoting conductive coating.

It was extremely surprising to find that a film which has been coated with an amount of from 0.5 to 100 mg/m$^2$, preferably from 2 to 50 mg/m$^2$, and particularly preferably from 10 to 25 mg/m$^2$, of the dried residue of a hydrolyzed aminosilane compound exhibits, on the coated side, markedly better adhesion of the coating comprising ITO particles to the film.

If the aminosilane coating simultaneously comprises organic conductive components, it has proven advisable for the amount of dried residue, based on pure aminosilane content, to be ≦10 mg/m$^2$, preferably ≦7.5 mg/m$^2$, and particularly preferably ≦5 mg/m$^2$.

In another preferred embodiment, at least one side of the film is coated with an aqueous dispersion which comprises the abovementioned compounds that improve properties. The thickness of the coating on the finished film is from 5 to 1000 nm, preferably from 10 to 500 nm, particularly preferably from 20 to 200 nm. The coating is preferably applied in-line, i.e during the film production process, advantageously prior to transverse stretching. Particular preference is given to application of the coating by means of the reverse gravure-roll coating process, which can apply the coatings extremely homogeneously in layer thicknesses up to 200 nm. Preference is likewise given to the application of the coating via the Mayer rod process, which can achieve relatively high coating thicknesses. The coating is preferably applied in the form of a solution, suspension, or dispersion, particularly preferably in the form of an aqueous solution, suspension, or dispersion. The coating mentioned gives the film surface or the film the desired functions (low coefficient of friction, good processability, good roll formation, low level of static charging, and better performance in printing and adhesive-bonding), and other possible functions. By way of example, the resultant film can have an improved aroma barrier or can permit adhesion to materials which would not otherwise adhere to the film surface, e.g. photographic emulsions.

The substances/compositions mentioned are applied in the form of a dilute solution, emulsion, or dispersion, preferably in the form of an aqueous solution, emulsion, or dispersion, to one or both film surfaces, and the solvent/the dispersion medium is then evaporated. If the coating is applied in-line prior to transverse stretching, the heat treatment during transverse stretching and the subsequent heat-setting is usually sufficient to evaporate the solvent/the dispersion medium and to dry the coating.

The aqueous dispersion comprises acrylic copolymers as solid constituent. The copolymers preferably used are comprised in essence of at least 50% by weight of one or more polymerized acrylic and/or methacrylic monomers and from 1 to 15% by weight of a copolymerizable comonomer which can bring about intermolecular crosslinking in the copolymerized state on exposure to an elevated temperature, if appropriate without addition of any separate resin-type crosslinking agent.

The amount preferably present of the acrylic component of the copolymers is from 50 to 99% by weight, and is preferably composed of an ester of methacrylic acid, in particular of an alkyl ester whose alkyl group contains up to 10 carbon atoms, e.g. the methyl, ethyl, n-propyl, isopropyl, n-butyl, isobutyl, tert-butyl, hexyl-2-ethylhexyl, heptyl, or n-octyl group. When acrylic copolymers derived from a lower alkyl acrylate ($C_1$-$C_4$), in particular ethyl acrylate, are used together with a lower alkyl methacrylate, they give particularly good adhesion between the polyester film and reprographic or matt coatings applied thereto. Very particular preference is given to adhesion-promoter copolymers composed of an alkyl acrylate, e.g. ethyl acrylate or butyl acrylate, together with an alkyl methacrylate, e.g. methyl methacrylate, in particular in equal molar fractions and in a total amount of from 70 to 95% by weight. The amount present of the acrylate comonomer of these acrylic/methacrylic combinations is preferably from 15 to 65 mol %, and the fraction present of the methacrylate comonomer is preferably greater than the fraction of the acrylate comonomer, generally by from 5 to 20 mol %. The proportion of the methacrylate present in the combination is preferably from 35 to 85 mol %.

To increase solvent resistance, use may be made, if appropriate, of comonomers suitable for bringing about crosslinking, e.g. N-methylolacrylamide, -methylolmethacrylamide, and the corresponding ethers; epoxy materials, e.g. glycidyl acrylate, glycidyl methacrylate, and allyl glycidyl ether; monomers containing carboxy groups, e.g. crotonic acid, itaconic acid, or acrylic acid; anhydrides, e.g. maleic anhydride or itaconic anhydride; monomers containing hydroxy groups, e.g. allyl alcohol and hydroxyethyl or hydroxypropyl acrylate or hydroxyethyl or hydroxypropyl methacrylate; amides, such as acrylamide, methacrylamide, or maleamide, and isocyanates, such as vinyl isocyanate or allyl isocyanate. Among the abovementioned crosslinking comonomers, preference is given to N-methylolacrylamide and N-methylolmethacrylamide, specifically and primarily because copolymer chains which contain one of these monomers are capable of condensing with one another when exposed to elevated temperatures, and therefore of bringing about the desired intermolecular crosslinking. However, any solvent resistance desired from the preferred acrylate coating may also be achieved via the presence of a foreign crosslinker, e.g. of a melamineformaldehyde condensate or urea-formaldehyde condensate. If no solvent resistance is needed, crosslinking agents can be omitted.

The inventive coating described above is described in detail in U.S. Pat. No. 4,571,363, which is expressly incorporated herein by way of reference. That publication also gives information concerning other specific combinations of these mixed acrylic copolymers.

The additives, e.g. particles, UV stabilizers, etc., may be introduced into the polymer by means of a commercially available twin-screw extruder. Polyester pellets are introduced here together with the particles/additives into the extruder and extruded, then quenched in a water bath, and then pelletized. However, in one preferred process for preparing the inventive polyesters, the additives are added directly during the preparation of the polyester. In the case of the DMT process, the additives are usually added after the transesterification or directly prior to the polycondensation (e.g. by way of the transport line between transesterification and polycondensation vessels) in the form of a glycolic dispersion. However, the addition may also take place prior to the start of the transesterification. In the case of the TPA process, the addition preferably takes place at the start of the polycondensation. However, later addition is also possible. In the case of this process it has proven advantageous to filter the glycolic dispersions through a PROGAF PGF® 57 (Hayward Ind. USA) filter prior to addition.

The present invention also provides a process for producing the film. Production usually takes place via an extrusion or coextrusion process known per se. It has proven particularly advantageous to add the additives used, such as particles, UV stabilizers, flame retardants, hydrolysis stabilizers, and antioxidants, in the form of predried or precrystallized masterbatches, prior to the extrusion process.

In masterbatch technology it is preferable that the particle size and the bulk density of the masterbatches are similar to the particle size and the bulk density of the polyester raw material used, thus achieving homogeneous dispersion, resulting in homogeneous properties.

The polyester films may be produced in the form of a single- or multilayer film, by known processes from a polyester raw material and, if appropriate, from other raw materials and, if appropriate, from other additives.

Masterbatches have preferably been precrystallized and/or predried. The same applies to masterbatches which comprise particles, UV stabilizer(s), flame retardants, and/or other additives. The predrying includes progressive heating of the masterbatches under reduced pressure (from 20 to 80 mbar, preferably from 30 to 60 mbar, in particular from 40 to 50 mbar), with stirring, and, if appropriate, afterdrying at a constant elevated temperature (likewise under reduced pressure). It is preferable for the masterbatch to be charged batchwise at room temperature from a feed vessel in the desired blend together with the polyester raw material and, if appropriate, with other raw material components into a vacuum dryer in which the temperature profile moves from 10 to 160° C., preferably from 20 to 150° C., in particular from 30 to 130°

C., during the course of the drying time or residence time. During the residence time of about 6 hours, preferably 5 hours, in particular 4 hours, the raw material mixture is stirred at from 10 to 70 rpm, preferably from 15 to 65 rpm, in particular from 20 to 60 rpm. The resultant precrystallized or predried raw material mixture is post-dried in a downstream vessel, likewise evacuated, at temperatures of from 90 to 180° C., preferably from 100 to 170° C., in particular from 110 to 160° C., for from 2 to 8 hours, preferably from 3 to 7 hours, in particular from 4 to 6 hours.

In the preferred extrusion or coextrusion process for the production of the film, the melts corresponding to the individual layers of the film are extruded or coextruded through a flat film die and quenched in the form of a substantially amorphous prefilm on a chill roll. This film is then reheated, and oriented longitudinally and transversely, or transversely and longitudinally, or longitudinally, transversely, and again longitudinally and/or transversely. The film temperatures in the stretching process are generally above the glass transition temperature Tg of the polyester used by from 10 to 60° C., and the longitudinal stretching ratio is usually from 2 to 6, in particular from 3 to 4.5, the transverse stretching ratio usually being from 2 to 5, in particular from 3 to 4.5, the ratio for any second longitudinal and transverse stretching carried out usually being from 1.1 to 5. The first longitudinal stretching may also be carried out simultaneously with the transverse stretching (simultaneous stretching). The heat-setting of the film follows at oven temperatures of from 180 to 260° C., in particular from 220 to 250° C. The film is then cooled and wound.

In one preferred embodiment, the heat-setting takes place at from 220 to 250° C., and the film is relaxed transversely at this temperature by at least 1%, preferably at least 2%. In another preferred embodiment, this treatment is followed by another transverse relaxation, again by at least 1%, preferably at least 2%, at temperatures of from 180 to 150° C. in the cooling phase.

In another preferred embodiment, the film is stretched by at least a factor of 3 in MD and TD, and this stretching takes place in a simultaneous frame. The heat-setting takes place at from 220 to 250° C., and the film is relaxed longitudinally and transversely by at least 1%, preferably at least 2%, at this temperature.

The invention applies a coating comprising ITO particles and/or ATO particles to this oriented and relaxed polyester film. The invention also provides that the coating comprises at least one other conductive component and/or the film is equipped with at least one other conductive layer.

1. Description of Coating Comprising ITO Particles/ATO Particles

The content of ITO nanoparticles/ATO nanoparticles in the coating dispersion is usually from 1 to 80% by weight, preferably from 10 to 60% by weight, and particularly preferably from 20 to 40% by weight. The proportion of other components, such as emulsifiers/dispersing agents and the like, besides the solvent(s), is generally $\leq 10\%$ by weight, preferably $\leq 4\%$ by weight, particularly preferably $\leq 1\%$ by weight.

The invention coats the film with a coating dispersion which comprises ITO and/or ATO particles with $d_{50} \leq 100$ nm, preferably $\leq 80$ nm, and particularly preferably $\leq 60$ nm. The preparation of these particles and that of the dispersions comprising these particles is inter alia described in JP-A-2001-082557. However, preference is given to use of ready-to-use dispersed particles from the producer Nanogate (Saarbrücken, DE) or Advanced Nano Products Co., Ltd. (KR), particularly preferably in the form of aqueous dispersions. A particular aqueous dispersion used is S6N from Nanogate, which comprises ITO particles.

The invention coats at least one side of the film with a dispersion which comprises ITO particles and/or ATO particles and, if appropriate, comprises organic conductive polymers b). The thickness of the dry coating on the finished film is from 5 to 5000 nm, preferably from 100 to 1500 nm, particularly preferably from 20 to 200 nm. The coating is preferably applied off-line by known processes, i.e. after production of the oriented and relaxed film. Particular preference is given to the application of the coating by means of the reverse gravure-roll coating process, which can apply the coatings extremely homogeneously in layer thicknesses up to 200 nm. Preference is likewise given to the application of the coating via the Meyer rod process, which can achieve relatively high coating thicknesses. The coating is preferably applied in the form of a solution, suspension, or dispersion, particularly preferably in the form of an aqueous solution, suspension, or dispersion.

It is also possible for the coating comprising ITO particles/ATO particles to be applied to the film by the in-line method after all of the orientation and relaxation steps.

If the inventive film has no conductive coating other than the layer comprising ITO particles/ATO particles, the layer comprising ITO particles/ATO particles always comprises another conductive component, preferably an organic conductive component.

2. Description of Possible Other Conductive Layer 2.1 Metallization Onto/Below the Layer Comprising ITO Particles/ATO Particles In one preferred embodiment, at least one side of the inventive film has been metallized, preferably using vapor deposition to apply an aluminum layer or aluminum zinc layer, and particularly preferably a copper layer, silver layer, or gold layer. The layer thickness is adjusted so that the transparency of the metallized film is in the range from 30 to 80%, preferably from 40 to 75%, and particularly preferably from 50 to 70%. In the case of vapor-deposited aluminum, the resultant layer thickness is from 100 to 1000 Å.

The metallization is applied by commercially available metallizing systems, for example those supplied by Applied Films (Hanau, DE). Particularly in the case of transparency values above 45%, it has proven advantageous to achieve the extremely thin metal layers by increasing the film speed at a constant application rate, as for 45% transparency, rather than by making a further reduction in the metal application rate. A layer which comprises the ITO particles/ATO particles a) is then applied to the metal layer.

If appropriate, the metallization may also take place onto the layer comprising ITO particles/ATO particles, or onto a film previously coated with organic polymer.

2.2 Coating with a Layer Comprising Organic Conductive Polymers b) Below the Layer Comprising ITO Particles/ATO Particles In one preferred embodiment, at least one side of the inventive film has been equipped with a coating comprising an organic conductive component b), and the layer comprising the ITO particles/ATO particles a) is applied to this layer.

The conductive layer comprising component b) may be applied either in-line or else off-line. In contrast to the layer comprising ITO particles/ATO particles a), it can also be oriented after the application process. The additional layers comprising organic conductive material may also be applied to the layer comprising ITO particles/ATO particles a), but this is less preferred.

It has also proven advantageous for the coating comprising conductive polymers itself to comprise small amounts of the ITO particles/ATO particles. Preference is given here to a proportion of from 0.5 to 5% by weight in the coating dispersion, particular preference being given to from 0.5 to 2% by weight. This measure simultaneously achieves better adhesion of the relevant layers to one another.

The organic conductive component b) in the layers may be composed either of an individual component or else take the form of any desired mixture of electrically conductive polymers, particularly polymers (as described in U.S. Pat. No. 5,665,498 and U.S. Pat. No. 5,674,654) containing substituted or unsubstituted pyrrole, polymers (as described in U.S. Pat. No. 5,300,575; U.S. Pat. No. 5,312,681; U.S. Pat. No. 5,354,613; U.S. Pat. No. 5,370,981; U.S. Pat. No. 5,372,924; U.S. Pat. No. 5,391,472; U.S. Pat. No. 5,403,467; U.S. Pat. No. 5,443,944; U.S. Pat. No. 5,575,898; U.S. Pat. No. 4,987,042, and U.S. Pat. No. 4,731,408) containing substituted or unsubstituted thiophene, polymers (as described in U.S. Pat. No. 5,716,550 and U.S. Pat. No. 5,093,439) containing substituted or unsubstituted aniline, and polyisothianaphthenes. The electrically conductive polymer may be dispersible or soluble in organic solvents or water or a mixture of the two. For environmental reasons, aqueous solutions or dispersions are preferred. Preferred polyanions of the electrically conductive polymers are anions of polycarboxylic acids, e.g. polyacrylic acid, polymethacrylic acid, polymaleic acid, or polysulfonic acids, such as polystyrenesulfonic acid, polyvinylsulfonic acid, preference being given to the polysulfonic acids. The polysulfonic acids and polycarboxylic acids may also be used in the form of copolymers or mixtures with one another. The molar mass of the polyacids is preferably from 1,000 to 2,000,000 g/mol and particularly preferably from 200,000 to 500,000 g/mol. The polyacids or their alkali metal salts are widely available, examples being polystyrenesulfonic acid and polyacrylic acid, or can be prepared by well-known methods. For the purposes of the invention, preferred electrically conductive polymers are polypyrrole-styrenesulfonate (described in U.S. Pat. No. 5,674,654 as polypyrole/poly-styrenesulfonic acid), 3,4-dialkoxy-substituted polypyrrole-styrenesulfonates, and 3,4-dialkoxy-substituted polythiophene-styrenesulfonate. For the purposes of the invention, particular preference is given to poly(3,4-ethylenedioxypyrrole-styrenesulfonate) and poly(3,4-ethylenedioxythiophene-styrenesulfonate).

For the purposes of the invention, particular preference is also given to the use of BAYTRON® P (poly(3,4-ethylenedioxythiophene)/poly(styrene-sulfonates)) from H.C. Starck (DE). As described above, the conductive polymers may be dispersed or dissolved in aqueous or organic solvents, and this dispersion can be mixed with the dispersion comprising ITO particles and/or ATO particles. However, for the purposes of the invention particular preference is given to addition of the organic conductive polymers and counter-ions, e.g. of BAYTRON® P, to the ITO dispersion/ATO dispersion, or to dispersing the organic conductive polymers together with the ITO nanoparticles/ATO nanoparticles. The latter method is particularly preferred because it can give particularly stable dispersions, and no agglomeration of the nanoparticles occurs on addition of the organic conductive polymers to the dispersion or of the organic conductive dispersion to the dispersion.

The coating solutions/coating dispersions comprising the organic conductive compounds are preferably water-based and comprise water-soluble polymers as binders. Examples of suitable polymers are polyvinyl alcohol, polyethylene oxide, polystyrenesulfonate, polyacrylamide, hydrophilic colloids (such as gelatine), or latices insoluble in water (particular preference being given to latices which comprise polymers based on vinylidene chloride, on polyester, or on polyurethane), or water-dispersible polymers, such as polyurethanes, polyesters, polyesterionomers, polyamides, and polyepoxides. The proportion of the organic conductive component b) in the dried residue is from 0.5 to 60% by weight, preferably from 10 to 40% by weight, and particularly preferably from 20 to 35% by weight.

If the film already has a conductive layer, the layer comprising ITO particles/ATO particles a) may comprise another conductive component b), but it can also be used without this other conductive component. However, the use of organic conductive components is preferred, because, surprisingly, this can markedly reduce the conductivity loss of the film after exposure to flexural stresses during processing and in use.

The proportion of ITO particles/ATO particles in the dried residue varies within the limits of 30-99.8% by weight. In the case of coatings without any content of the organic conductive components b), it is from 90 to 99.8% by weight, and in the case of coatings with organic conductive components b) it is from 30 to 90% by weight, preferably from 60 to 85% by weight, and particularly preferably from 70 to 80% by weight.

The inventive single- or multilayer films have the good mechanical properties demanded. For example, the modulus of elasticity in at least one film direction (longitudinal (MD) and/or transverse (TD)) is at least 500 N/mm$^2$, preferably at least 2000 N/mm$^2$, and particularly preferably at least 4000 N/mm$^2$. The ultimate tensile strength values in at least one film direction (longitudinal (MD) and/or transverse (TD)) are $\geq$50 N/mm$^2$, preferably $\geq$100 N/mm$^2$, and particularly preferably $\geq$150 N/mm$^2$. The tensile-strength-at-break values in at least one film direction (longitudinal (MD) and/or transverse (TD)) are $\geq$10%, preferably $\geq$40%, and particularly preferably $\geq$80%.

It was more than surprising that the combination of a coating comprising ITO particles/ATO particles with another conductive coating can achieve conductivities markedly higher than those obtainable purely by increasing the layer thickness of the ITO layer/ATO layer.

It was moreover more than surprising that addition of organic conductive material to the coating comprising ITO particles/ATO particles also led to a marked rise in conductivity, considerably superior to that achievable solely by increasing the amount of ITO/ATO.

The combination of their properties makes the inventive films suitable for a wide variety of uses, for example for printed circuit boards, ribbon cables, smart cards, RFID labels, LCD displays, membrane keyboards, and film-based circuits of any type.

The individual properties in the examples were measured using the standards and methods stated below.

Measurement Methods

Mechanical Properties

Modulus of elasticity, ultimate tensile strength, tensile strain at break, and $F_5$ value are measured longitudinally and transversely to ISO 527-1-2 with the aid of a tensile strain tester (Zwick, 010, Ulm, DE).

Shrinkage

Thermal shrinkage is determined on square samples of film with edge length 10 cm. The samples were measured precisely (edge length $L_0$), heat-conditioned for 15 minutes at 200° C. in a cabinet with air circulation and then measured precisely at room temperature (edge length L). Shrinkage is calculated from the following equation:

$$\text{Shrinkage [\%]} = 100 * (L_0 - L)/L$$

Measurement of Average Diameter $d_{50}$

Average diameter $d_{50}$ is determined by means of a laser on a Malvern Mastersizer by the standard method (an example of other measurement equipment being the Horiba LA 500 or Sympathec Helos, which use the same principle of measurement). For this, the samples were placed with water in a cell, which was then placed in the measurement equipment. The measurement procedure is automatic and also includes the mathematical determination of $d_{50}$ values.

The $d_{50}$ value here is defined as the value determined from the (relative) cumulative particle size distribution curve: the point of intersection of the 50% ordinate value with the cumulative curve directly giving the desired $d_{50}$ value on the abscissa axis, as illustrated in more detail in FIG. 1.

Particles with $d_{50}$ values below 100 nm are analyzed qualitatively by means of an electron microscope, i.e. 10 film samples are analyzed in an electron microscope. The size of each of 100 randomly selected pigment particles of the nanoparticulate species is measured and the average is determined.

Seal Seam Strength

To determine seal seam strength, two film strips of width 15 mm are mutually superposed and sealed at 130° C. with a sealing time of 0.5 s and a sealing pressure of 2 bar, using NDS equipment from Brugger Feinmechanik (Munich, DE), using single-side-heated sealing jaws. The sealed surface amounts to about 15×9 mm. Seal seam strength is determined by the T-Peel method with the aid of a tensile strain tester (Zwick, 010, Ulm, DE). The two strip ends here were clamped into the opposite clips and separated at a velocity of 200 mm/min. The maximum force measured during this process is the seal seam strength, and is stated in N/15 mm.

Measurement of Surface Conductivity

The method of measurement is based on the TP-102-78 AIMCAL method. An ohmmeter and two electrodes of width 2 cm are used with 10 cm separation on a firm, non-conductive, flat surface. The sample, measuring at least 12×4 cm, is applied to the rubber sheet and the electrodes are placed at the separation mentioned on the conductive side of the sample, and the conductivity in ohm/cm$^2$ is read off from the calibrated ohmmeter.

Conductivity after Flexural Loading

At the start of the test, the resistivity of the sample is determined by the method described above. A sample of linear dimensions 18×4 cm, coated with conductive material is then clamped lengthwise into a tensile strain tester (Zwick, 010, Ulm, DE), the distance between the clips being 14 cm and the clamp length being 15 cm. The clip separation is then reduced 50 times to 7 cm and on each occasion returned back to the initial position. The advance rate of the clips here is 7 cm/min. Resistivity is then again measured by the method described above. The test is regarded as passed if the resistivity measured after the flexural stress has not increased by more than 5% when compared with the initial measurement. Each test is carried out on three samples.

Measurement of Transparency and Haze

The test uses a Hazeguard Hazemeter XL-211 from BYK Gardener (see FIG. 2). The test equipment is to be switched on 30 minutes prior to the test. Care has to be taken that the light beam passes through the sphere centrally to the exit aperture.

Production, Shape, and Number of Samples

Five samples of size 100×100 mm are cut out from each of the films to be studied. The longitudinal and transverse direction are marked on the margin, because tests take place in both machine directions.

Testing of Transparency and Haze
Press switch 1 "OPEN"
Set switch 2 to "×10" and calibrate digital display to 0.00, using the "Zero"knob
Move switch 1 to "Reference" and switch 2 to "×1"
Bring the digital display to 100, using the "Calibrate" knob
Insert sample longitudinally
Read-off displayed transparency value
Calibrate the digital display to 100, using the "Calibrate" knob
Set switch 1 to "OPEN"
Read-off displayed value for longitudinal haze
Rotate sample to transverse direction
Read-off displayed value for transverse haze Evaluation Transparency and haze are obtained by averaging the respective 5 individual values.

Film Production

Polyester chips were mixed in the ratios stated in the examples and precrystallized for 1 minute at 155° C. in a fluidized-bed drier, and then dried at 150° C. for 3 hours in a tower drier, and melted at 290° C. in a single-screw extruder. The molten polymer extrudates were brought together in a coextrusion die, and drawn off by way of a take-off roll (roll temperature 20° C.). The film was stretched by a factor of 3.5 in the machine direction at 116° C. (film temperature in the stretching gap) and transverse stretching by a factor of 3.2 was carried out in a frame at 110° C. The film was then heat-set at 229° C. and relaxed transversely by 1% at temperatures of from 229 to 200° C. and again by 1.5% at temperatures of from 180 to 150° C. The production rate (finished film speed) was 300 m/min.

Finished film thickness: 50 µm.

Metallization

The films were metallized with gold, using a TOPBEAM 1100 metallizing system from Applied Films (Hanau, DE). The transparency of the film after metallization was 65%.

In-line Coating
  a) Aminosilane Coating
    After a corona treatment, after longitudinal stretching, one side of the film was coated with aqueous aminosilane dispersion, by means of reverse gravure coating (conditions: 2% by weight of Z-6020 from Dow Corning (DE) in deionized water, wet application weight 2.5 g/m$^2$, corresponds to dry application weight of 16 mg/m$^2$).
  b) Conductive Coating (not the Coating Comprising ITO Particles/ATO Particles)
    After a corona treatment, after longitudinal stretching, the film was coated with a dispersion as stated in EP-A-1 253 166, Example E5, by means of reverse gravure coating.

Off-line coating
  a) ITO Coating Without Conductive Polymer
    40% by volume of an aqueous mixture composed of 4.5% by weight of a copolymer composed of 60% by weight of methyl methacrylate and 35% by weight of ethyl acrylate and 5% by weight of N-methylacrylamide, and also 0.4% of TRITON® X 100, were mixed with 60% by volume of S6N dispersion comprising ITO particles (25% by weight of ITO nanoparticles) from Nanogate, with vigorous stirring, and stirring of the mixture was continued.

b) ITO Coating With Conductive Polymer

38% by volume of an aqueous mixture composed of 4.5% by weight of a copolymer composed of 60% by weight of methyl methacrylate and 35% by weight of ethyl acrylate and 5% by weight of N-methylacrylamide, and also 0.4% of TRITON® X 100, were mixed with 60% by volume of S6N dispersion comprising ITO particles, and 2% by volume of BAYTRON® P, with vigorous stirring, and stirring of the mixture was continued.

Each of the dispersions obtained in a) and b) was applied to the polyester film by means of the Meyer rod process, the resultant thickness of the dried layer amounting to 1 μm. The coated film was passed through an oven at 110° C. and, for final drying, was subjected to blown air at 170° C.

EXAMPLES

The following raw materials were used in the examples:

Masterbatch MB1

MB1 comprises 0.4% by weight of SYLYSIA® 310 (Fuji, JP) and 0.8% by weight of AEROSIL® OX 50 (Degussa, DE), and 98.8% by weight of polyethylene terephthalate (PET). The pigments were added during the polycondensation process. The catalyst/stabilizer system is composed of 20 ppm of Ti derived from C94 titanium catalyst (Acordis), 50 ppm of Mn derived from $Mn(Ac)_2$, and 20 ppm of P derived from phosphoric acid.

Masterbatch MB2

MB2 comprises 0.6% by weight of SYLYSIA® 340 and 0.8% by weight of AEROSIL® OX 50, and 98.6% by weight of polyethylene terephthalate (PET). The pigments were added during the polycondensation process. The catalyst/stabilizer system is composed of 300 ppm of Sb derived from $Sb_2O_3$, 90 ppm of Mn derived from $Mn(Ac)_2$, and 50 ppm of P derived from phosphoric acid.

Masterbatch MB3

MB3 comprises 60% by weight of polyethylene terephthalate (PET) and 40% by weight of isophthalate. The pigments were added during the polycondensation process. The catalyst/stabilizer system is composed of 20 ppm of Ti from C94 titanium catalyst, 50 ppm of Mn derived from $Mn(Ac)_2$, and 20 ppm of P derived from phosphoric acid.

Masterbatch MB4

MB4 comprises 10% by weight of 2-(4,6-diphenyl-1,3,5-triazin-2-yl)-5-(hexyl)oxyphenol (TINUVIN® 1577, Ciba-Geigy, CH) UV stabilizer, alongside PET. The catalyst/stabilizer system is composed of 20 ppm of Ti from C94 titanium catalyst, 50 ppm of Mn derived from $Mn(Ac)_2$, and 20 ppm of P derived from phosphoric acid.

Raw Material R1

100% by weight of RT 49 polyethylene terephthalate from Kosa (DE) The catalyst/stabilizer system is composed of 20 ppm of Ti from C94 titanium catalyst, 50 ppm of Mn derived from $Mn(Ac)_2$, and 20 ppm of P derived from phosphoric acid.

Raw Material R2

100% by weight of RT 49 polyethylene naphthalate, raw material from Kosa (DE).

The catalyst/stabilizer system is composed of 20 ppm of Ti from C94 titanium catalyst, 50 ppm of Mn derived from $Mn(Ac)_2$, and 20 ppm of P derived from phosphoric acid.

Raw Material R3

100% by weight of RT 49 polyethylene terephthalate

The catalyst/stabilizer system is composed of 300 ppm of Sb from $Sb_2O_3$, 90 ppm of Mn derived from $Mn(Ac)_2$, and 50 ppm of P derived from phosphoric acid.

Example 1

An ABC film was produced as described above with thickness 50 μm, the thickness of each of the outer layers A and C being 2 μm. Outer layer C comprised 10% by weight of MB1 and 90% by weight of R1, the base layer comprised 70% by weight of R1 and 30% by weight of internal regrind obtained from the present ABC film, and outer layer A comprised 2.5% by weight of MB1 and 97.5% by weight of R1. The film was coated off-line as described above with a coating comprising ITO particles a) and organic polymers b).

Example 2

As Example 1; however, as described above, the film was first metallized and then coated off-line with a coating comprising ITO particles.

Example 3

As Example 2; however, the coating process described above was carried out with a mixture composed of ITO particles and of organic conductive polymer, instead of the coating comprising only ITO particles.

Example 4

As Example 2; however, an in-line coating with organic conductive polymer was applied in place of the metallization.

Example 5

As Example 4; however, the coating process described above, using a mixture composed of ITO particles and of organic conductive polymer replaced the coating comprising only ITO particles. In addition, the base layer of the film was composed of 30% by weight of internal regrind, 60% by weight of R1, and 10% by weight of MB4.

Example 6

As Example 1; however, the film was first in-line-coated as described above with organic conductive polymer, then metallized, and finally coated using a coating with a mixture composed of ITO particles and of organic conductive polymer.

Example 7

As Example 2; however, prior to metallization the film was in-line-coated as described above with aminosilane.

Example 8

As Example 1; however, prior to off-line coating with a mixture composed of ITO particles and of organic conductive polymer, as described above, the film was in-line-coated with aminosilane.

Example 9

As Example 3; however, the outer layer A to which the coating is applied, was composed of 95% by weight of raw material R2 and 5% by weight of MB1.

Example 10

As Example 1; however, outer layer C was composed of 95% by weight of MB3 and 5% by weight of MB1. Outer layer C makes the film sealable.

Comparative Example 1

Film as in Example 1; however, a coating was applied off-line and comprised only the ITO particles and no component b). The flexural test described above was not passed here in two of three instances.

Comparative Example 2

The film was produced as described above. However, after transverse stretching the film was not heat-set and was not relaxed. This is an ABA film. Each of the outer layers comprised 40% by weight of MB 2 and 60% by weight of R3, and the base layer comprised 70% by weight of R3 and 30% by weight of internal regrind. As described above, the film was first in-line-coated with organic conductive polymer and then off-line-coated with coatings comprising ITO particles.

Comparative Example 3

As Example 1, however the coating comprising ITO particles and comprising organic conductive polymers was applied in-line by analogy with the aminosilane coating.

Comparative Example 4

Film production and coating were carried out as in Example 6 of EP-A-0 962 482.

In all of the examples and comparative examples, the coating process took place on the side A. The properties of the corresponding films can be found in the table. The term "internal regrind" always means regrind from the film of the relevant example.

The invention claimed is:

1. A transparent, electrically conductive biaxially oriented, single- or multilayer polyester film, comprising a non-stretched coating which comprises (a) conductive (ITO) indium tin oxide particles or (ATO) antimony tin oxide particles, or a mixture of these, said film also comprising one or more organic conductive polymers (b), said conductive polymers (b) being found either in the coating comprising ITO particles and/or ATO particles and/or in a layer in contact therewith, wherein the conductive coating has a surface resistivity of from $10^0$ to $10^7$ ohm/cm$^2$, said film exhibits a higher conductivity than a comparable film absent said organic conductive polymers (b), the organic conductive polymer (b) is a substituted or unsubstituted pyrrole-containing polymer, a substituted or unsubstituted thiophene-containing polymer, a substituted or unsubstituted aniline-containing polymer, or a polyisothianaphthene, said coating further comprising acrylic copolymers, present in an amount of up to 10% by night, said acrylic copolymer including from 1 to 15% by weight of intermolecular-crosslinked comonomer and the proportion of ITO and/or ATO particles, based on the dry residue of the coating, is within the range from 30 to 99.8% by weight.

2. The film as claimed in claim 1, wherein the polyester is polyethylene terephthalate, polybutylene terephthalate, polyethylene naphthalate, or a mixture thereof.

3. The film as claimed in claim 1, wherein the $d_{50}$ of the ITO particles and ATO particles is $\leq 100$ nm.

4. The film as claimed in claim 1, wherein the proportion of ITO and/or ATO particles is from 90 to 99.8% by weight in the case of coatings without the organic conductive components (b) and is from 30 to 90% by weight in the case of coatings with organic conductive components (b).

5. The film as claimed in claim 1, wherein the content of the organic conductive component (b), based on the dry residue, is from 0.5 to 60% by weight.

6. The film as claimed in claim 1, which further comprises one of more of particulate additives, fillers, antiblocking agents, UV stabilizers, flame retardants, hydrolysis stabilizers, and antioxidants.

Table

| Example | Off-line ITO coating | Off-line ITO + org. cond. coating | Metallization | In-line org. cond. polymer | In-line amino-silane | Haze prior to off-line coating [%] | Shrinkage, TD 200° C. [%] | Transparency of coated film [%] | Conductivity [ohm/cm$^2$] | Flexural test passed* |
|---|---|---|---|---|---|---|---|---|---|---|
| 1 |   | + |   |   |   | 1.8 | 1.5 | 83 | 7 * 10$^5$ | yes |
| 2 | + |   | + |   |   | 2 | 1.2 | 60 | 3 * 10$^4$ | (yes) |
| 3 |   | + | + |   |   | 1.9 | 1.3 | 58 | 4 * 10$^2$ | yes |
| 4 | + |   |   | + |   | 2.1 | 1.4 | 84 | 5 * 10$^4$ | (yes) |
| 5 |   | + |   | + |   | 2.2 | 0.9 | 80 | 6 * 10$^2$ | yes |
| 6 |   | + | + | + |   | 2.2 | 1.1 | 51 | 1 * 10$^2$ | yes |
| 7 | + |   | + |   | + | 2.1 | 1.0 | 59 | 1 * 10$^4$ | (yes) |
| 8 |   | + |   |   | + | 2.0 | 1.1 | 82 | 2 * 10$^5$ | yes |
| 9 |   | + | + |   |   | 1.7 | 0.8 | 59 | 2 * 10$^2$ | yes |
| 10 |   | + |   |   |   | 1.7 | 1.5 | 83 | 6 * 10$^5$ | yes |
| ce** |   |   |   |   |   |   |   |   |   |   |
| 1 | + |   |   |   |   | 1.7 | 1.5 | 85 | 5 * 10$^7$ | no |
| 2 |   | + |   |   |   | 6 | 45 | 75 | 3 * 10$^8$ | (yes) |
| 3 |   |   |   | + inc. ITO in-line |   | 4 | 1.6 | 65 | 2 * 10$^9$ | (no) |
| 4 |   |   |   |   |   |   | 5.2 | 77 | 3 * 10$^8$ |   |

*Flexural test: conductivity after flexural stress: yes = all three off the samples passed the test, (yes) = only two samples passed, (no) = two of three samples did not pass the test, no = all three of the samples did not pass the test
**ce = comparative example 7. The film as claimed in claim 1, further comprising a silicone coating.

8. The film as claimed in claim 1, wherein the polyester film is a three-layer A-B-C or A-B-A film.

9. A process for producing a transparent, electrically conductive, biaxially oriented, single- or multilayer polyester film as claimed in claim 1, which comprises extruding, together through a flat-film die, the melts corresponding to the individual layers of the film, cooling the resultant film, and then reheating it, biaxially orienting it, and then heat-setting it and cooling it, and applying, to the cooled film, a coating comprised of (a) conductive (ITO) indium tin oxide particles or (ATO) antimony tin oxide particles, or of a mixture of these, and also applying other conductive components (b), the conductive components (b) being found either in the coating comprising the ITO particles and ATO particles or in a layer in contact therewith.

10. Printed circuit boards, ribbon cables, smartcards, RFID labels, LCD displays, membrane keyboards, or film-based circuits comprising film as claimed in claim 1.

11. An electrically conductive film according to claim 1, wherein said polyester film comprises polyester having less than or equal to 50 ppm of titanium catalyst and said film has a haze of less than or equal to 4%.

12. An electrically conductive film according to claim 1, wherein the conductive coating has a surface resistivity ranging from $1 \times 10^0$ to $1 \times 10^3$ ohm/cm$^2$.

13. An electrically conductive film according to claim 1, wherein the film has a transparency for light of wavelength in the range from 410 to 750 nm of greater than or equal to 70%.

14. A transparent, electrically conductive film comprising
(i) a polyester film;
(ii) a first coating disposed on a first side of said film, said first coating comprising one or more components selected from metal or organic conductive polymer; and
(iii) a second, outer coating disposed on said first coating, said second coating comprising at least one of indium tin oxide particles or antimony tin oxide particles and optionally including said organic conductive polymer,
wherein said film includes said organic conductive polymer in at least one of said first or second coatings and said film exhibits a higher conductivity than a comparable film in the absence of said organic conductive polymer,
said film exhibits a surface resistivity of from $10^0$ to $5 \times 10^4$ ohm/cm$^2$,
said first coating comprises organic conductive polymer and
a third coating is disposed between said first and second coatings, said third coating comprising metal.

15. An electrically conductive film according to claim 14, wherein said second coating further comprises organic conductive polymer.

16. An electrically conductive film according to claim 14, wherein said second coating comprises organic conductive polymer.

17. An electrically conductive film comprising
(i) a polyester film;
(ii) a first coating disposed on a first side of said film, said first coating comprising metal and
(iii) a second, outer coating disposed on said first coating, said second coating comprising at least one of indium tin oxide particles or antimony tin oxide particles and further including said organic conductive polymer,
wherein said film exhibits a higher conductivity than a comparable film in the absence of said organic conductive polymer,
said film exhibits a surface resistivity of from $10^0$ to $5 \times 10^4$ ohm/cm$^2$ and,
a third coating is disposed between said film and said first coating, said third coating comprising aminosilane.

18. A transparent, electrically conductive film comprising
(i) a polyester film;
(ii) a first coating comprising conductive polymer disposed on a first side of said film; and
(iii) a second, outer coating disposed on said first coating, said second coating comprising at least one of indium tin oxide particles or antimony tin oxide particles and optionally including organic conductive polymer,
wherein said film exhibits a surface resistivity of from $10^0$ to $5 \times 10^4$ ohm/cm$^2$.

* * * * *

UNITED STATES PATENT AND TRADEMARK OFFICE
CERTIFICATE OF CORRECTION

PATENT NO. : 7,534,487 B2  
APPLICATION NO. : 11/083767  
DATED : May 19, 2009  
INVENTOR(S) : Klein et al.

Page 1 of 1

It is certified that error appears in the above-identified patent and that said Letters Patent is hereby corrected as shown below:

Claims  
Column 20  
Claim 1  
Line 21, delete "night" insert --weight--  
Claim 5  
Line 39, delete "component" insert --polymer--

Signed and Sealed this

Thirtieth Day of June, 2009

JOHN DOLL  
*Acting Director of the United States Patent and Trademark Office*